United States Patent [19]

Kadomura

[11] Patent Number: 5,078,833
[45] Date of Patent: Jan. 7, 1992

[54] DRY ETCHING METHOD

[75] Inventor: Shingo Kadomura, Kanagawa, Japan

[73] Assignee: Sony Corporation, Tokyo, Japan

[21] Appl. No.: 555,032

[22] Filed: Jul. 20, 1990

[30] Foreign Application Priority Data

Jul. 21, 1989 [JP] Japan .................................. 1-89175
Sep. 28, 1989 [JP] Japan .................................. 2-53441

[51] Int. Cl.$^5$ ..................... H01L 21/306; B44C 1/22;
C03C 15/00; C03C 25/06
[52] U.S. Cl. .................................. 156/643; 156/646;
156/647; 156/653; 156/657; 156/659.1;
156/662; 204/192.37; 252/79.1
[58] Field of Search ............... 156/643, 646, 647, 648,
156/653, 657, 659.1, 662; 252/79.1; 204/192.37;
427/38, 39

[56] References Cited

U.S. PATENT DOCUMENTS

| 4,690,729 | 9/1987 | Douglas | 156/643 |
| 4,784,720 | 11/1988 | Douglas | 156/643 |
| 4,855,017 | 8/1989 | Douglas | 156/653 X |
| 4,885,054 | 12/1989 | Shibagaki | 156/643 |

FOREIGN PATENT DOCUMENTS

| 0036144 | 9/1981 | European Pat. Off. . |
| 0272143 | 6/1988 | European Pat. Off. . |
| WO/81/02947 | 10/1981 | PCT Int'l Appl. . |
| WO/85/02818 | 7/1985 | PCT Int'l Appl. . |

Primary Examiner—William A. Powell
Attorney, Agent, or Firm—Hill, Van Santen, Steadman & Simpson

[57] ABSTRACT

A dry etching process utilizes a gas to form a side wall protecting layer, which gas has added at least chlorine trifluoride, or in the alternative silicon and fluorine as component.

6 Claims, 2 Drawing Sheets

DRY ETCHING METHOD

BACKGROUND OF THE INVENTION

1. Field of the Invention

The present invention relates generally to a dry etching method. More specifically, the invention relates to a dry etching method applicable for semiconductor manufacture by performing anisotrophic etching.

2. Description of the Background Art

In the recent semiconductor technologies silicon trench etching techniques have become important in ultra-large LSI (ULSI) manufacture for development of applications for fabrication of high mega-bit DRAM, high speed bipolar device and so forth. For performing the etching process, various etching gasses have been developed and used. Typically, fluorine (F) type gas, chlorine (Cl) type gas, or mixture thereof are used as the etching gas. For example, the Japanese Patent First (unexamined) Publication (Tokkai) Showa 63-73526 discloses an etching method utilizing $SiCl_4/N_2$ type gas.

In the conventional dry etching method for monocrystalline silicon, a $SiO_2$ mask is formed on the inner periphery perpendicular to the plane of a monocrystal substrate and, then, etching is performed with $SiCl_4/N_2$ type etching gas. In this process, $Si_xN_y$ which is a reaction product generated during the etching process is used as a protective layer for forming a trench.

However, this prior proposed dry etching process is still incomplete and defective in the following points.

At first, in the prior proposed process, the reaction product forming the protecting layer, can serve for obstructing etching and thus can lower the etching speed or efficiency. Furthermore, in case of a batch type etcher or in case of the making a relatively wide trench, the etching rate or efficiency can be lowered due to a loading effect. In order to solve such a problem of low efficiency, there has been proposed to use $SF_6/SiCl_4/N_2$ type etching gas in "1988 Shuuki Obutsu" 7a-K-7. In this prior proposal, the contamination can be caused.

On the other hand, when the pattern is not possible to be formed by lithographic process and has to be patterned by a self-alignment process, the self-alignment process is performed by forming side wall by $SiO_2$ with utilizing tetraethoxysilane and performing the etching while utilizing the thus formed side wall as a mask. In such case, the taper on the side wall may influence or cause scattering of the injected ion beam to cause a scoop or under-cut at the location immediately beneath the mask. This makes it difficult to form the desired configuration of the trench.

SUMMARY OF THE INVENTION

Therefore, it is an object of the present invention to provide a dry etching method which can provide satisfactorily high etching rate with suppression of a loading effect.

Another object of the present invention is to provide a dry etching process which can perform etching process for forming a desired configuration of a trench even when the trench is so designed to easily cause scattering of ion beam.

In order to accomplish the aforementioned and other objects, a dry etching process, according to the present invention, utilizes a gas forming a side wall protecting layer, which is added at least chlorine trifluoride, or in the alternative silicon and fluorine as component.

According to one aspect of the invention, a composite gas for dry etching for forming a desired configuration of a trench in a monocrystalline silicon, is composed of:

a base composite gas for etching the monocrystalline silicon; and an additive gas added to the base composite gas, the additive gas containing at least $ClF_3$ for forming a protective layer on the side wall of the trench.

Preferably, the base composite gas is selected from $SiCl_4/N_2$ type gas, $Cl_2/N_2$ type gas, $Cl_2/O_2$ type gas, $Br_2/N_2$ type gas, $HBr/N_2$ type gas, $SiCl_4/O_2$ type gas. On the other hand, the additive gas is preferable added to the base composite gas in a content range of 1 to 90%.

According to another aspect of the invention, a composite gas for dry etching for forming a desired configuration of a trench in a monocrystalline silicon, is compose of:

a base composite gas for etching the monocrystalline silicon; and an additive gas added to the base composite gas, the additive gas containing at least Si and F as components.

Preferable, the base composite gas is selected from $SiCl_4/N_2$ type gas and $Br_2/N_2$ type gas. On the other hand, the additive gas is $SiF_4$ gas.

According to a further aspect of the invention, a dry etching process for forming a trench in a monocrystalline silicon, comprises the steps of:

forming an opening in a $SiO_2$ layer formed on a monocrystalline silicon according to a desired etching pattern;

performing etching while utilizing a residual $SiO_2$ layer as a masking layer and with an etching gas, which is composed of:

a base composite gas for etching the monocrystalline silicon; and an additive gas added to the base composite gas, the additive gas containing at least $ClF_3$ for forming a protective layer on the side wall of the trench.

According to a still further aspect of the invention, a dry etching process for forming a trench in a monocrystalline silicon, comprises the steps of:

forming an opening in a $SiO_2$ layer formed on a monocrystalline silicon according to a desired etching pattern;

performing etching while utilizing a residual $SiO_2$ layer as a masking layer and with an etching gas, which is composed of:

a base composite gas for etching the monocrystalline silicon; and an additive gas added to the base composite gas, the additive gas containing at least Si and F as components.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1:
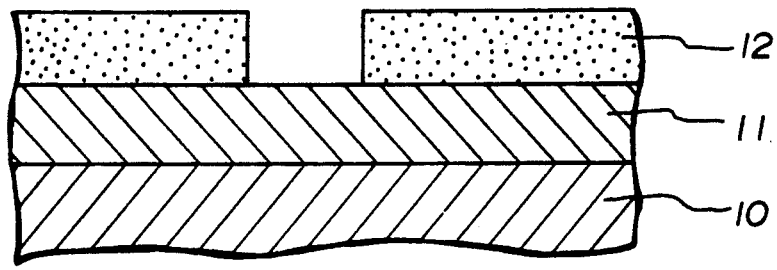
FIGS. 1(A), 1(B) and 1(C) are cross sectional views showing mutually different stages in the preferred embodiment of a dry etching process according to the invention.
Figure 1:
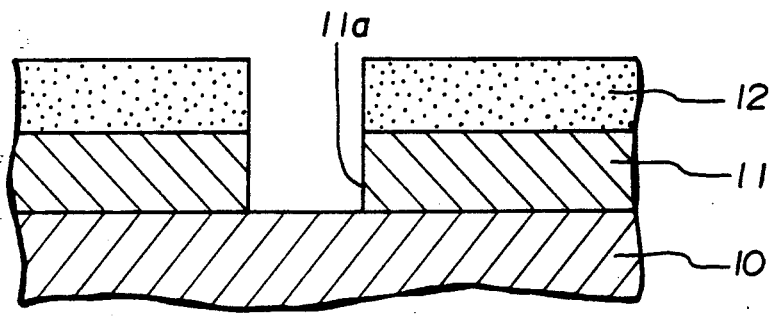
Figure 1:
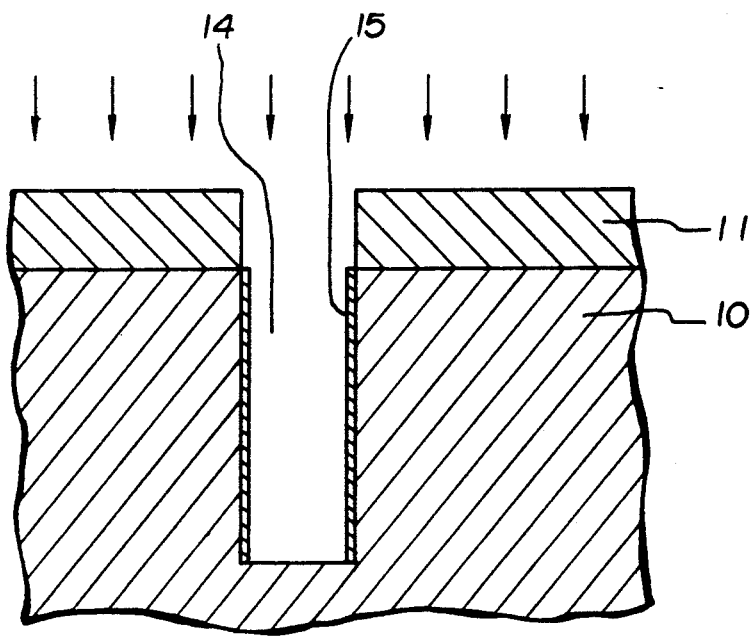

Referring now to the drawings, particularly to FIGS. 1(A), 1(B) and 1(C), the preferred etching process as illustrated will be dicussed in terms of etching for a monocrystalline silicon substrate. As can be seen, a $SiO_2$ layer 11 is formed on a monocrystalline silicon substrate 10. On the $SiO_2$ layer 11, a resist layer 12 is formed. The resist layer 12 defines an opening 14 at the location where a trench is to be formed in the initial stage, as shown in FIG. 1(A). The opening 14 in the resist layer is formed by a known patterning process.

Then, utilizing the resist layer 12 as a mask, reactive ion beam etching (RIE) is used for forming opening 11a through the $SiO_2$ layer, as shown in FIG. 1(B). After forming the opening 11a in the $SiO_2$ layer, the resist layer 12 is removed. Then, a trench of a desired depth is formed by means of a bias charge type ECR etching device, as shown in FIG. 1(C). During this etching process the $SiO_2$ layer may serve as a mask.

The etching process for forming the trench is performed in the following conditions. The pressure is set at 10 mTorr. RF bias is applied at 300 W. $SiCl_4/N_2$ type gas is used for forming a side wall protecting layer 15. In order to improve the etching rate, 10% of $ClF_3$ is added.

It was found that radical fluorine ($F^*$) and radical chlorine ($Cl^*$) generated by dissociation of $ClF_3$ serve for improving the etching rate. Therefore, a presence of $ClF_3$ in the gas for forming the protecting layer 15 of the side wall, may compensate for lowering of an etching rate due to the loading effect. As a result, even when the area to be etched is wide to possibly cause the loading effect, the etching rate can be maintained at a satisfactorily high level.

It will be appreciated that the bonding energy of $ClF_3$ is $Cl$-$F$=61.4 Kcal/mol, which is smaller than $SF_6$ (S-F=90 Kcal/mol), $NF_3$ (N-F=63 Kcal/mol) and $CF_4$ (C-F=107 Kcal/mol). As can be seen herefrom, since $ClF_3$ has a smaller bonding energy than other gases, $Cl^*$ and $F^*$ can be obtained more easily than the others.

It should appreciated that though the gas used in the preferred process is specified as a $SiC_4/N_2$ type gas for which $ClF_3$ is added, any appropriate gas, such as $Cl_2/N_2$ type, $Cl_2/O_2$ type, $Br_2/N_2$ type, $HBr/N_2$ type, $SiCl_4/O_2$ type gases and so forth, can be used as replacements for the specific gas. Therefore, the type of the gas for which $ClF_3$ is added, is to be considered not essential to the subject matter of the invention. Furthermore, though the content of $ClF_3$ is specified as 10%, the content may be variable in a range of 1% to 90%. In addition, as a gas for performing etching and forming a protective layer on the side wall, gas composed of chlorine, bromine and compound thereof can also be used. Similarly to the above, $ClF_3$ can be added to the gas in the content of 1% to 90%. Furthermore, it may be possible to add a rare gas.

Figure 2:
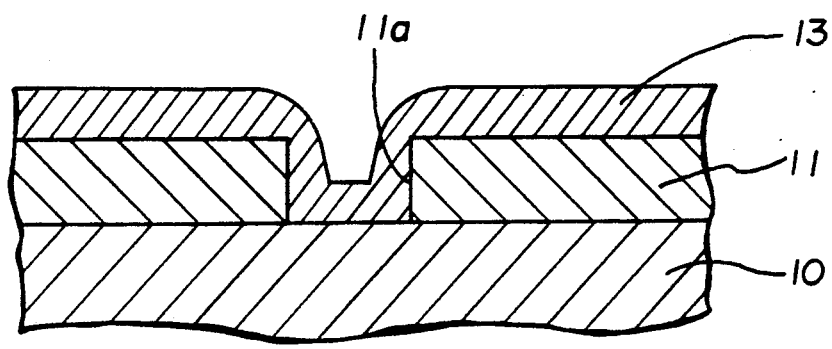
FIGS. 2(A) and 2(B) are cross sectional views showing another preferred process of a dry etching process according to the present invention.
Figure 2:
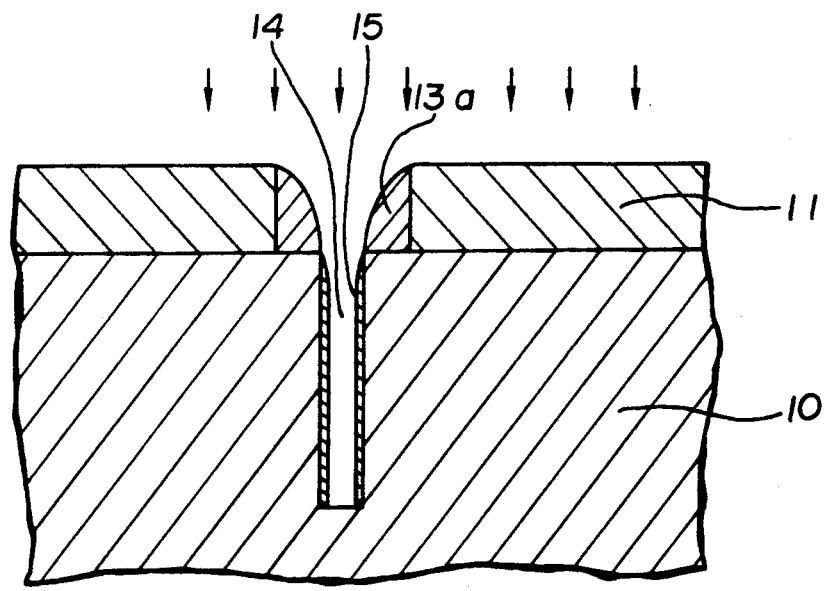

FIGS. 2(A) and 2(B) show another preferred process for implementing the present invention. In FIG. 2(A), the silicon substrate 10 is formed with $SiO_2$ layer 11 in the thickness of 1.0 μm. An opening 11a having a greater diameter than the desired diameter of the trench is formed through the $SiO_2$ layer 11. In the shown example, the diameter of the opening is set in 1.0 μm. For this substrate, chemical vapor deposition (CVD) is performed with utilizing TEOS gas as a source gas for forming a $SiO_2$ layer 13 of a thickness of 4000 Å. Then, an etch-back treatment is performed for forming side wall 13a on the side wall of the opening 11a. The internal diameter of the side wall 13a is 0.3 μm. The side wall 13a thus formed have a taper of 60° to 70° due to the influence of the etch-back.

Thereafter, with utilizing the TEOS layer and $SiO_2$ layer 11 as a mask, etching is performed by means of a bias charge type ECR etching apparatus for forming a trench 14 of a desired depth, as shown in FIG. 2(B). Through this etching process, the side wall protecting layer 15 is formed.

The followings are the conditions for performing etching for forming a trench. As an etching gas; a mixture gas of $SiCl_4$, $N_2$ and $SiF_4$ is used. These gases are supplied in the flow rate ratio of $SiCl_4/N_2/SiF_4$=10 SCCM/10 SCCM/10 SCCM. The pressure is set at 10 mTorr, the microwave power is set at 850 W and Vdc is set at −250 V. During the etching process with the foregoing condition, $F^*$ is generated from $SiF_4$ to prevent lowering of the etching rate. Furthermore, Si in the $SiF_4$ may serve to protect the side wall for avoiding the scoop, under-cut or so forth. Therefore, with the shown process, the desired configuration of the trench can be formed.

Though the specific gas $SiF_4$, i.e. Si and F containing gas, can be added not only for the specified combined gas but also for other combination of gases, such as $Br_2/N_2$. In the later case, the $SiF_4$ is added in the flow rate ratio of $Br_2/N_2/SiF_4$=10 SCCM/10 SCCM/10 SCCM. When the etching process is performed in the condition set forth above, equivalent result can be obtained.

Therefore, the present invention fulfills all of the objects and advantages sought therefor.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A composite gas for dry etching for forming a desired configuration of trench in a monocrystalline silicon, composed of:
   a base composite gas for etching the monocrystalline silicon; and
   an additive gas added to said base composite gas, said additive gas containing at least $ClF_3$ for forming protective layer on the side wall of said trench.

2. A composite gas as set forth in claim 1, wherein said base composite gas is selected among $SiCl_4/N_2$ type gas, $Cl_2/N_2$ type gas, $Cl_2/O_2$ type gas, $Br_2/N_2$ type gas, $HBr/N_2$ type gas, $SiCl_4/O_2$ type gas.

3. A composite gas as set forth in claim 1, wherein said additive gas is added to the base composite gas in a range of 1 to 90%.

4. A dry etching process for forming a trench in a monocrystalline silicon, comprising the steps of:

forming an opening in SiO$_2$ layer formed on a monocrystalline silicon according to a desired etching pattern;

performing etching with utilizing residual SiO$_2$ layer as a masking layer and with an etching gas, which is composed of:

a base composite gas for etching the monocrystalline silicon; and an additive gas added to said base composite gas, said additive gas containing at least ClF$_3$ for forming protective layer on the side wall of said trench.

5. A dry etching process as set forth in claim 4, wherein said base composite gas is selected among SiCl$_4$/N$_2$ type gas, Cl$_2$/N$_2$ type gas, Cl$_2$/O$_2$ type gas, Br$_2$/N$_2$ type gas, HBr/N$_2$ type gas, SiCl$_4$/O$_2$ type gas.

6. A dry etching process as set forth in claim 4, wherein said additive gas is added to the base composite gas in a range of 1 to 90%.

* * * * *